US012652029B2

(12) United States Patent
Tsai et al.

(10) Patent No.: US 12,652,029 B2
(45) Date of Patent: \*Jun. 9, 2026

(54) INPUT BUFFER CIRCUIT

(71) Applicant: TAIWAN SEMICONDUCTOR MANUFACTURING COMPANY, LTD., Hsinchu (TW)

(72) Inventors: Yu-Kai Tsai, Hsinchu (TW); Chia-Hui Chen, Hsinchu (TW); Chia-Jung Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 30 days.

This patent is subject to a terminal disclaimer.

(21) Appl. No.: 18/521,169

(22) Filed: Nov. 28, 2023

(65) Prior Publication Data

US 2024/0097662 A1     Mar. 21, 2024

Related U.S. Application Data

(63) Continuation of application No. 17/338,107, filed on Jun. 3, 2021, now Pat. No. 11,863,189.

(Continued)

(51) Int. Cl.
| | |
|---|---|
| *H03K 3/00* | (2006.01) |
| *H03K 3/037* | (2006.01) |
| *H03K 3/13* | (2006.01) |
| *H03K 3/3565* | (2006.01) |
| *H03K 19/0185* | (2006.01) |

(52) U.S. Cl.
CPC ............. *H03K 3/0377* (2013.01); *H03K 3/13* (2013.01); *H03K 3/3565* (2013.01); *H03K 19/018521* (2013.01)

(58) Field of Classification Search
CPC ...... H03K 3/0377; H03K 3/13; H03K 3/3565; H03K 19/018521
See application file for complete search history.

(56) References Cited

U.S. PATENT DOCUMENTS

| | | | |
|---|---|---|---|
| 5,003,196 A | 3/1991 | Kawaguchi |
| 5,278,462 A | 1/1994 | Wilson |

(Continued)

FOREIGN PATENT DOCUMENTS

| | | |
|---|---|---|
| DE | 4215423 | 11/1993 |
| EP | 0107189 | 5/1984 |

(Continued)

*Primary Examiner* — Tuan T Lam
(74) *Attorney, Agent, or Firm* — Hauptman Ham, LLP

(57) ABSTRACT

An integrated circuit includes an upper threshold circuit configured to set a logic level of a first enabling signal, a lower threshold circuit configured to set a logic level of a second enabling signal, and a control circuit configured to change an output voltage signal in response to a condition that the logic level of the first enabling signal and the logic level of the second enabling signal are changed consecutively. In the control circuit, a first switch is electrically connected to a second switch at a buffer output node. The control circuit includes a regenerative circuit configured to maintain the output voltage signal at the buffer output node while each of the first switch and the second switch is at a disconnected state.

20 Claims, 8 Drawing Sheets

Related U.S. Application Data

(60) Provisional application No. 63/157,211, filed on Mar. 5, 2021.

(56)                     References Cited

U.S. PATENT DOCUMENTS

| 2001/0011915 | A1  |  8/2001 | Aoki |
| 2007/0297812 | A1  | 12/2007 | Takeuchi |
| 2010/0301900 | A1  | 12/2010 | Deng |
| 2021/0013873 | A1* |  1/2021 | Chen ................ H03K 19/00315 |
| 2021/0159890 | A1  |  5/2021 | Tercariol |
| 2022/0123738 | A1  |  4/2022 | Gupta |

FOREIGN PATENT DOCUMENTS

| EP | 0690570   |  1/1996 |
| JP | 57-75024  |  5/1982 |
| JP | 62-298218 | 12/1987 |

* cited by examiner

INPUT BUFFER CIRCUIT

PRIORITY CLAIM AND CROSS-REFERENCE

The present application is a continuation of U.S. application Ser. No. 17/338,107, filed Jun. 3, 2021, now U.S. Pat. No. 11,863,189, issued Jan. 2, 2024, which claims the priority of U.S. Provisional Application No. 63/157,211, filed Mar. 5, 2021, each of which is incorporated herein by reference in its entirety.

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
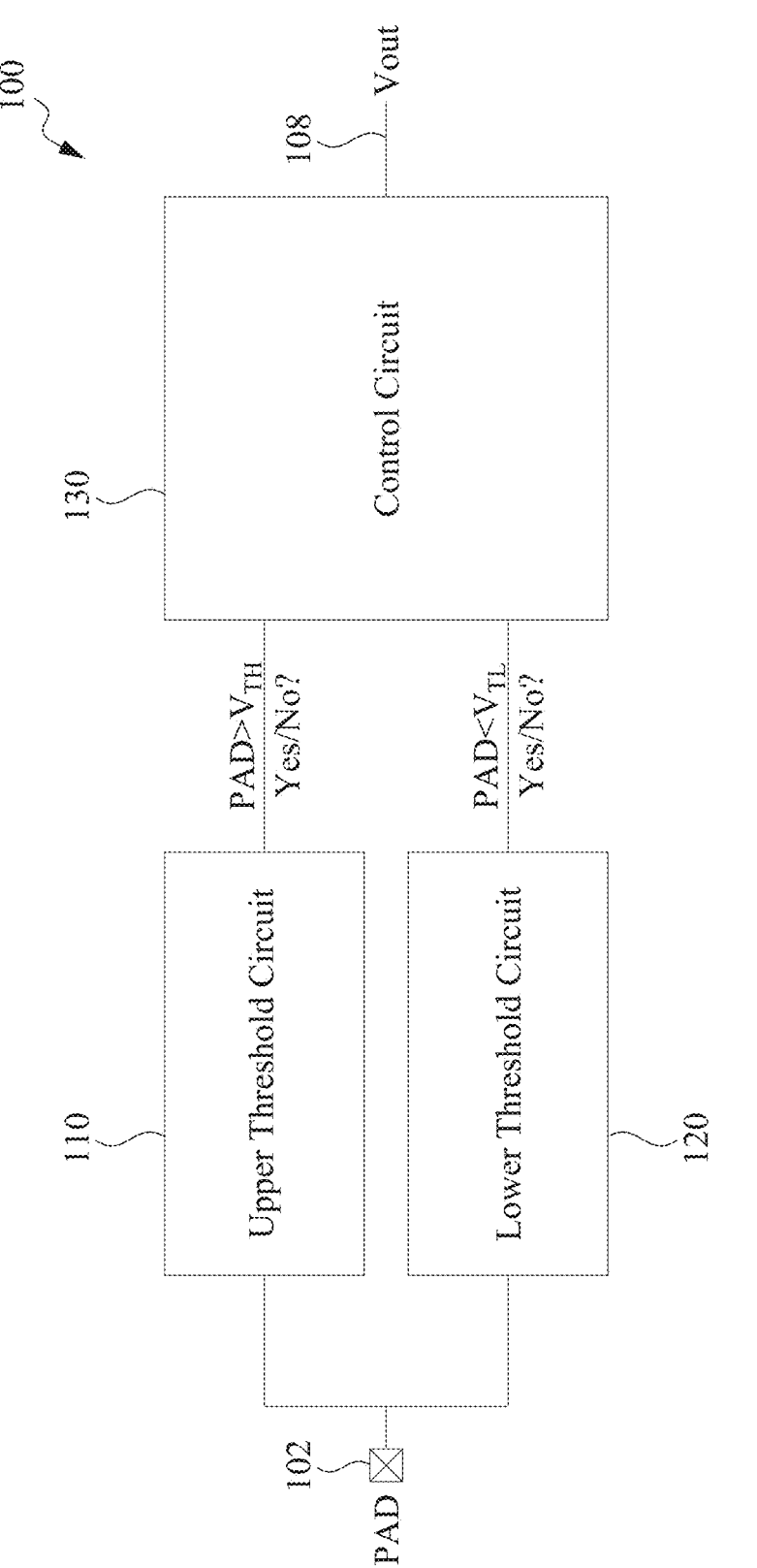
FIG. 1A is a schematic diagram of an input buffer circuit having two threshold circuits and one control circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An input buffer circuit couples an input voltage signal from a transmitting circuit in a first power domain to a receiving circuit in a second power domain. The input buffer circuit receives the input voltage signal and generates an output voltage signal. The input buffer circuit has a lower threshold voltage and an upper threshold voltage. In some embodiments, a first enabling signal is generated based a comparison between the input voltage signal and the upper threshold voltage, and a second enabling signal is generated based a comparison between the input voltage signal and the lower threshold voltage. In some embodiments, based on the first enabling signal and the second enabling signal, the output voltage signal changes between a first voltage level and a second voltage level. When the input voltage signal rises and consecutively crosses the lower threshold voltage and then the upper threshold voltage, the output voltage signal changes from the first voltage level to the second voltage level. When the input voltage signal falls and consecutively crosses the upper threshold voltage and then the lower threshold voltage, the output voltage signal changes from the second voltage level to the first voltage level.

The difference between the upper threshold voltage and the lower threshold voltage is the hysteresis window. If the upper threshold voltage and the lower threshold voltage are determined by the supply voltages in the second power domain for the receiving circuit and uncorrelated to the supply voltages in the first power domain for the transmitting circuit, then the ratio between the hysteresis window and the supply voltage difference in the first power domain will decrease as the supply voltage difference in the first power domain increases. A supply voltage difference in a power domain is the voltage difference between an upper supply voltage and a lower supply voltage in the power domain. In some embodiments of the present disclosure, each of the upper threshold voltage in an upper threshold circuit (for generating the first enabling signal) and the lower threshold voltage in a lower threshold circuit (for generating the second enabling signal) is adjusted to enlarge the hysteresis window if the supply voltage difference in the first power domain increases. Additionally, in some embodiments, the hysteresis window degradation due to process, voltage, and temperature variations is further reduced by the improved implementation of the upper threshold circuit and the lower threshold circuit, as compared with some alternative designs of input buffer circuits without similar threshold circuits.

FIG. 1A is a schematic diagram of an input buffer circuit 100 having two threshold circuits and one control circuit, in accordance with some embodiments. The input buffer circuit 100 includes an upper threshold circuit 110, a lower threshold circuit 120, and a control circuit 130. The upper threshold circuit 110 and the lower threshold circuit 120 are configured to receive an input voltage signal PAD at an input node 102 of the input buffer circuit 100. The upper threshold circuit 110 is configured to generate a first enabling signal $EN_{up}$ based on a comparison between the input voltage signal PAD and the upper threshold voltage $V_{TH}$. In some embodiments, if the input voltage signal PAD is larger than the upper threshold voltage $V_{TH}$, then the first enabling signal $EN_{up}$ generated by the upper threshold circuit 110 is set to be logic TRUE. The lower threshold circuit 120 is configured to generate a second enabling signal $EN_{dn}$ based on a comparison between the input voltage signal PAD and the lower threshold voltage $V_{TL}$. In some embodiments, if the input voltage signal PAD is smaller than the lower threshold voltage $V_{TL}$, then the second enabling signal $EN_{dn}$ generated by the lower threshold circuit 120 is set to be logic TRUE. The first enabling signal $EN_{up}$ and the second enabling signal $EN_{dn}$ are coupled to the control circuit 130. The control circuit 130 is configured to generate an output voltage signal Vout at the output node 108 of the control circuit 130 based on the first enabling signal $EN_{up}$ and the second enabling signal $EN_{dn}$.

In operation, the input voltage signal PAD at the input node 102 is provided by electronic circuits in a first power domain, and the output voltage signal Vout generated by the input buffer circuit 100 at the output node 108 is coupled to electronic circuits in a second power domain. In some embodiments, the electronic circuits in the first power domain are connected between the power supply voltages VDDH and VSS, and the electronic circuits in the second power domain are connected between the power supply voltages VDDL and VSS. In some embodiments, the power supply voltage VSS is connected to the common ground, and the power supply voltage VDDH in the first power domain is 2.5V (or 3.3V) while the power supply voltage VDDL in the second power domain is 1.8V. In some embodiments, the power supply voltage VSS is connected to common ground, and the power supply voltage VDDH in the first power domain is 1.8V (or 2.5V) while the power supply voltage VDDL in the second power domain is 1.2V. In some embodiments, the power supply voltage VDDH is higher than 3.3V. In some embodiments, the power supply voltage VDDL is smaller than 1.2 V. Other examples of the power supply voltage VDDH and the power supply voltage VDDL are within the contemplated scope of the present disclosure. During operation, the voltage levels of the input voltage signal PAD at the input node 102 of the input buffer circuit 100 generally are in a range from VSS to VDDH, and the output voltage signal Vout generated at the output node 108 of the input buffer circuit 100 is in a range from VSS to VDDL.

Figure 1B:
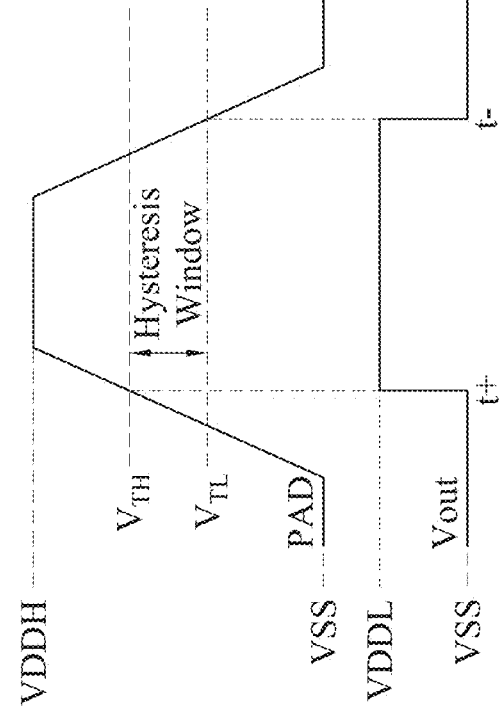
FIG. 1B is a diagram of waveforms of an input voltage signal and an output voltage signal of the input buffer circuit, in accordance with some embodiments.

FIG. 1B is a diagram of waveforms of the input voltage signal PAD at the input node 102 and the output voltage signal Vout at the output node 108 of the input buffer circuit 100, in accordance with some embodiments. In FIG. 1B, the input voltage signal PAD rises from voltage VSS to voltage VDDH and stays at the voltage VDDH for some time; then the input voltage signal PAD falls from voltage VDDH to voltage VSS. As the input voltage signal PAD is rising from voltage VSS and changing towards voltage VDDH, the output voltage signal Vout changes from voltage VSS to voltage VDDL at time t+, when the input voltage signal PAD crosses an upper threshold voltage $V_{TH}$. The output voltage signal Vout stays at voltage VDDL, while the input voltage signal PAD reaches voltage VDDH and stays at voltage VDDH. The output voltage signal Vout changes from voltage VDDL to voltage VSS at time t−, when the input voltage signal PAD crosses a lower threshold voltage $V_{TL}$, as the input voltage signal PAD is falling from voltage VDDH and changing towards voltage VSS. Because the signal waveform of the output voltage signal Vout changes within the range from VSS to VDDL, the output voltage signal Vout is a more suitable signal for the electronic circuits in the second power domain powered by the power supply voltages VDDL and VSS. In contrast, if the input voltage signal PAD is directly coupled to the electronic circuits in the second power domain, the peak voltage (such as VDDH) of the input voltage signal PAD may exceed the maximum durable voltage of the electronic circuits in the second power domain.

Figure 1C:
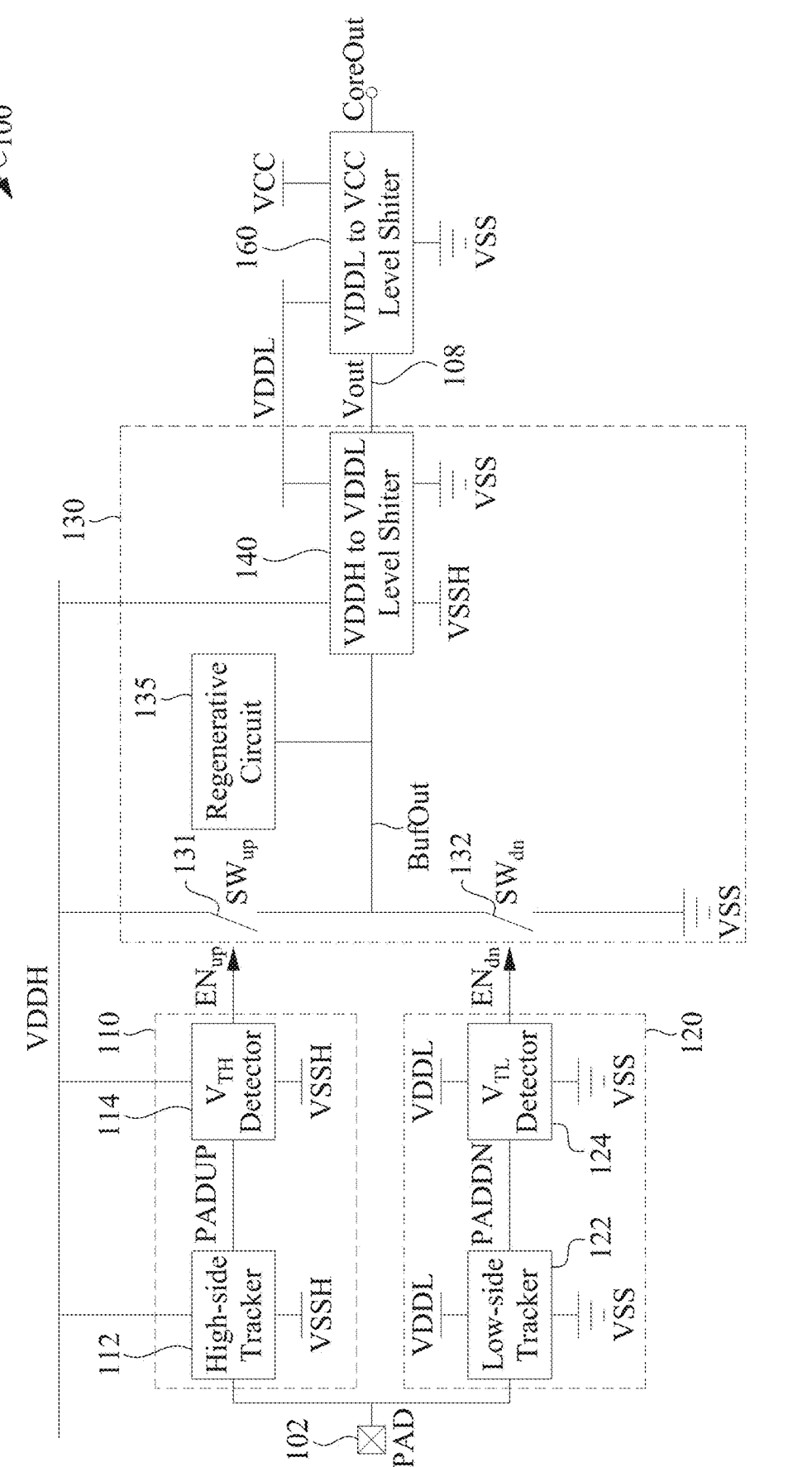
FIG. 1C is a schematic diagram of an implementation of the input buffer circuit of FIG. 1A in combination with level shifters, in accordance with some embodiments.

FIG. 1C is a schematic diagram of an input buffer circuit 100 of FIG. 1A having the control circuit implemented with switches, in accordance with some embodiments. In FIG. 1C, the upper threshold circuit 110 includes a high-side tracker 112 and an upper threshold detector 114. The high-side tracker 112 is configured to generate a tracking-up signal PADUP based on the input voltage signal PAD. The upper threshold detector 114 is configured to receive the tracking-up signal PADUP from the high-side tracker 112 and to set a logic level of the first enabling signal $EN_{up}$ based on the tracking-up signal PADUP. In FIG. 1C, the lower threshold circuit 120 includes a low-side tracker 122 and a lower threshold detector 124. The low-side tracker 122 is configured to generate a tracking-down signal PADDN based on the input voltage signal PAD. The lower threshold detector 124 is configured to receive the tracking-down signal PADDN from the low-side tracker 122 and to set a logic level of the second enabling signal $EN_{dn}$ based on the tracking-down signal PADDN.

In FIG. 1C, the control circuit 130 includes a first switch 131, a second switch 132, and a regenerative circuit 135. The first switch is electrically connected between the upper supply voltage VDDH and a buffer output node BufOut. The second switch is 132 electrically connected between the buffer output node BufOut and the lower supply voltage VSS. The regenerative circuit 135 is electrically coupled to the buffer output node BufOut. The regenerative circuit 135 maintains the voltage at the buffer output node BufOut when both the first switch 131 and the second switch 132 are at the disconnected state. The first switch 131 is controlled by the first enabling signal $EN_{up}$ received from the upper threshold detector 114. The second switch 132 is controlled by the second enabling signal $EN_{dn}$ received from the lower threshold detector 124. The buffer output node BufOut is coupled to the input terminal of the level shifter 140. The level shifter 140 is connected to the power supply VDDH in the first power domain and the power supply VDDL in the second power domain. The voltage signal at the input terminal of the level shifter 140 is within the voltage range of the first power domain, but the voltage signal at the output terminal of the level shifter 140 is within the voltage range of the second power domain. The output terminal of the level shifter 140 is the output node 108 of the input buffer circuit 100. The output voltage signal Vout at the output node 108 of the input buffer circuit 100 is within the voltage range of the second power domain. The operation of the input buffer circuit 100 in FIG. 1C is described with reference to FIGS. 2A-2F.

In some embodiments, the output voltage signal Vout at the output node 108 in the second power domain (having supply voltages VDDL and VSS) is further coupled to the electronic components in a third power domain (having supply voltages VCC and VSS) through the level shifter 160. The level shifter 160 is connected to the power supply VDDL in the second power domain and the power supply VCC in the third power domain. The voltage signal at the input terminal of the level shifter 160 is within the voltage range of the second power domain, but the voltage signal at the output terminal of the level shifter 160 is within the voltage range of the third power domain. In response to the input voltage signal PAD at the input node 102 of the input buffer circuit 10, the voltage signal CoreOut is generated at the output terminal of the level shifter 160 by the input buffer circuit 100 and the level shifter 160.

Figures 2A, 2B, 2C, 2D, 2E, 2F:
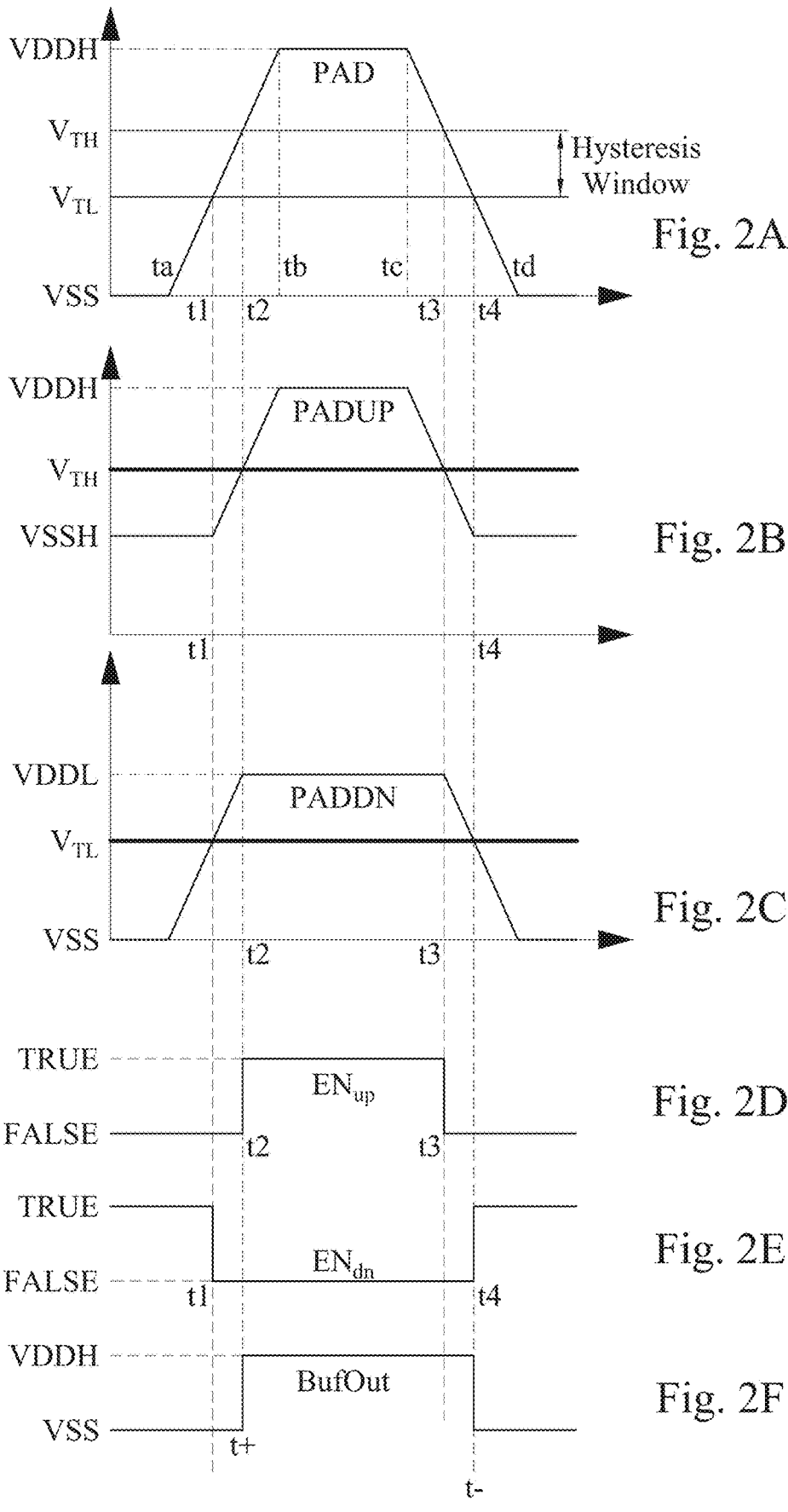
FIGS. 2A-2F are waveforms of signals in connection with the input buffer circuit of FIG. 1C, in accordance with some embodiments.

FIGS. 2A-2F are diagrams of waveforms of signals at the input node, the output node, and various other nodes in the input buffer circuit 100 of FIG. 1C, in accordance with some embodiments. FIG. 2A is the waveform of the input voltage signal PAD at the input node 102. FIG. 2B is the waveform of the tracking-up signal PADUP at the output of the high-side tracker 112. FIG. 2C is the waveform of the tracking-down signal PADDN at the output of the low-side tracker 122. FIG. 2D is the waveform of the first enabling signal $EN_{up}$ at the output of the upper threshold detector 114. FIG. 2E is the waveform of the second enabling signal $EN_{dn}$ at the output of the lower threshold detector 124. FIG. 2F is the waveform of the voltage at the buffer output node BufOut.

In the example waveform of FIG. 2A, during the time period from ta to tb, the input voltage signal PAD rises from voltage VSS to voltage VDDH. During the time period from tb to tc, the input voltage signal PAD remains at the voltage VDDH. During the time period from tc to td, the input voltage signal PAD falls from voltage VDDH to voltage VSS. During the time period from ta to tb when the input voltage signal PAD is rising, the input voltage signal PAD crosses the lower threshold voltage $V_{TL}$ at time t1 and crosses the upper threshold voltage $V_{TH}$ at time t2. During the time period from tc to td when the input voltage signal PAD is falling, the input voltage signal PAD crosses the upper threshold voltage $V_{TH}$ at time t3 and crosses the lower threshold voltage $V_{TL}$ at time t4.

The tracking-up signal PADUP at the output of the high-side tracker 112 follows the signal received at the input of the high-side tracker 112 if the signal received at the input is larger than a predetermined lower limiting voltage (such as VSSH), and the tracking-up signal PADUP is maintained at the predetermined lower limiting voltage (such as VSSH) if the signal received at the input is smaller than or equal to the predetermined lower limiting voltage. In the example waveform of FIG. 2B, the tracking-up signal PADUP is maintained at voltage VSSH until time t1 (which is the time at which the input voltage signal PAD rises above the lower threshold voltage $V_{TL}$). Then, the tracking-up signal PADUP follows the input voltage signal PAD from time t1 to time t4 (which is the time at which the input voltage signal PAD falls below the lower threshold voltage $V_{TL}$). The tracking-up signal PADUP is again maintained at voltage VSSH after time t4.

The tracking-down signal PADDN at the output of the low-side tracker 122 follows the signal received at the input of the low-side tracker 122 if the signal received at the input is smaller than a predetermined upper limiting voltage (such as VDDL), and the tracking-down signal PADDN is maintained at the predetermined upper limiting voltage (such as VDDL) if the signal received at the input is larger than or equal to the predetermined upper limiting voltage. In the example waveform of FIG. 2C, the tracking-down signal PADDN follows the input voltage signal PAD until time t2 (which is the time at which the input voltage signal PAD rises above upper the threshold voltage $V_{TH}$) Then, the tracking-down signal PADDN is maintained at voltage VDDL from time t2 to time t3 (which is the time at which the input voltage signal PAD falls below the upper threshold voltage $V_{TH}$). The tracking-down signal PADDN again follows the input voltage signal PAD after time t3.

In the example waveform of FIG. 2D, the first enabling signal $EN_{up}$ at the output of the upper threshold detector 114 is determined by comparing the tracking-up signal PADUP (received from the high-side tracker 112) with the upper threshold voltage $V_{TH}$. Before time t2, the tracking-up signal PADUP in FIG. 2B is below the upper threshold voltage $V_{TH}$, and the first enabling signal $EN_{up}$ in FIG. 2D is at logic FALSE. From time t2 to time t3, the tracking-up signal PADUP in FIG. 2B is above the upper threshold voltage $V_{TH}$, and the first enabling signal $EN_{up}$ in FIG. 2D is at logic TRUE. After time t3, the tracking-up signal PADUP in FIG. 2B is again below the upper threshold voltage $V_{TH}$, and the first enabling signal $EN_{up}$ in FIG. 2D is at logic FALSE.

In the example waveform of FIG. 2E, the second enabling signal $EN_{dn}$ at the output of the lower threshold detector 124 is determined by comparing the tracking-down signal PADDN (received from the low-side tracker 122) with the lower threshold voltage $V_{TL}$. Before time t1, the tracking-down signal PADDN in FIG. 2C is below the lower threshold voltage $V_{TL}$, and the second enabling signal $EN_{dn}$ in FIG. 2E is at logic TRUE. From time t1 to time t4, the tracking-down signal PADDN in FIG. 2C is above the lower threshold voltage $V_{TL}$, and the second enabling signal $EN_{dn}$ in FIG. 2E is at logic FALSE. After time t4, the tracking-down signal PADDN in FIG. 2C is again below the lower threshold voltage $V_{TL}$, and the second enabling signal $EN_{dn}$ in FIG. 2E is at logic TRUE.

In the examples embodiments of FIG. 1C, the first enabling signal $EN_{up}$ from the upper threshold detector 114 controls the first switch 131, and the second enabling signal $EN_{dn}$ received from the lower threshold detector 124 controls the second switch 132. When the first enabling signal $EN_{up}$ is at logic TRUE, the first switch 131 is at the connected state, which connects the buffer output node BufOut with the upper supply voltage VDDH. When the second enabling signal $EN_{dn}$ is at logic TRUE, the second switch 132 is at the connected state, which connects the buffer output node BufOut with the lower supply voltage VSS.

In the example waveform of FIG. 2F, the voltage at the buffer output node BufOut in FIG. 1C depends upon the first enabling signal $EN_{up}$ in FIG. 2D and the second enabling signal $EN_{dn}$ in FIG. 2E. Before time t1, because the first enabling signal $EN_{up}$ is at logic FALSE and the second enabling signal $EN_{dn}$ is at logic TRUE, the buffer output node BufOut is not connected to the upper supply voltage VDDH through the first switch 131 but the buffer output node BufOut is connected to the lower supply voltage VSS through the second switch 132. Consequently, the voltage at the buffer output node BufOut is at the lower supply voltage VSS.

From time t1 to time t2, because the first enabling signal $EN_{up}$ is at logic FALSE and the second enabling signal $EN_{dn}$ is at logic FALSE, the buffer output node BufOut is not connected to the upper supply voltage VDDH through the first switch 131 and the buffer output node BufOut is also not connected to the lower supply voltage VSS through the second switch 132. Consequently, during time t1 to time t2, the voltage at the buffer output node BufOut is still at the lower supply voltage VSS, because the voltage at the buffer output node BufOut at time t1 is maintained until time t2 by the regenerative circuit 135 when each of the first switch 131 and the second switch 132 is not at the connecting state.

From time t2 to time t3, because the first enabling signal $EN_{up}$ is at logic TRUE and the second enabling signal $EN_{dn}$ is at logic FALSE, the buffer output node BufOut is connected to the upper supply voltage VDDH through the first switch 131 but the buffer output node BufOut is not connected to the lower supply voltage VSS through the second switch 132. Consequently, the voltage at the buffer output node BufOut is at the upper supply voltage VDDH.

From time t3 to time t4, because the first enabling signal $EN_{up}$ is at logic FALSE and the second enabling signal $EN_{dn}$ is at logic FALSE, the buffer output node BufOut is not connected to upper supply voltage VDDH through the first switch 131 and the buffer output node BufOut is also not connected to the lower supply voltage VSS through the second switch 132. Consequently, during time t3 to time t4, the voltage at the buffer output node BufOut is still at the upper supply voltage VDDH, because the voltage at the buffer output node BufOut at time t3 is maintained until time t4 by the regenerative circuit 135 when each of the first switch 131 and the second switch 132 is not at the connecting state.

After time t4, because the first enabling signal $EN_{up}$ is at logic FALSE and the second enabling signal $EN_{dn}$ is at logic TRUE, the buffer output node BufOut is not connected to the upper supply voltage VDDH through the first switch 131 but the buffer output node BufOut is connected to the lower supply voltage VSS through the second switch 132. Consequently, the voltage at the buffer output node BufOut is at the lower supply voltage VSS.

In the example waveform of FIG. 2F, the voltage at the buffer output node BufOut changes from the lower supply voltage VSS to the upper supply voltage VDDH at time t+ (which is same as time t2), when the input voltage signal PAD crosses the upper threshold voltage $V_{TH}$ as the input voltage signal PAD is rising. The voltage at the buffer output node BufOut changes from the upper supply voltage VDDH to the lower supply voltage VSS at time t− (which is same as time t4), when the input voltage signal PAD crosses a lower threshold voltage $V_{TL}$ as the input voltage signal PAD is falling.

Figure 3:
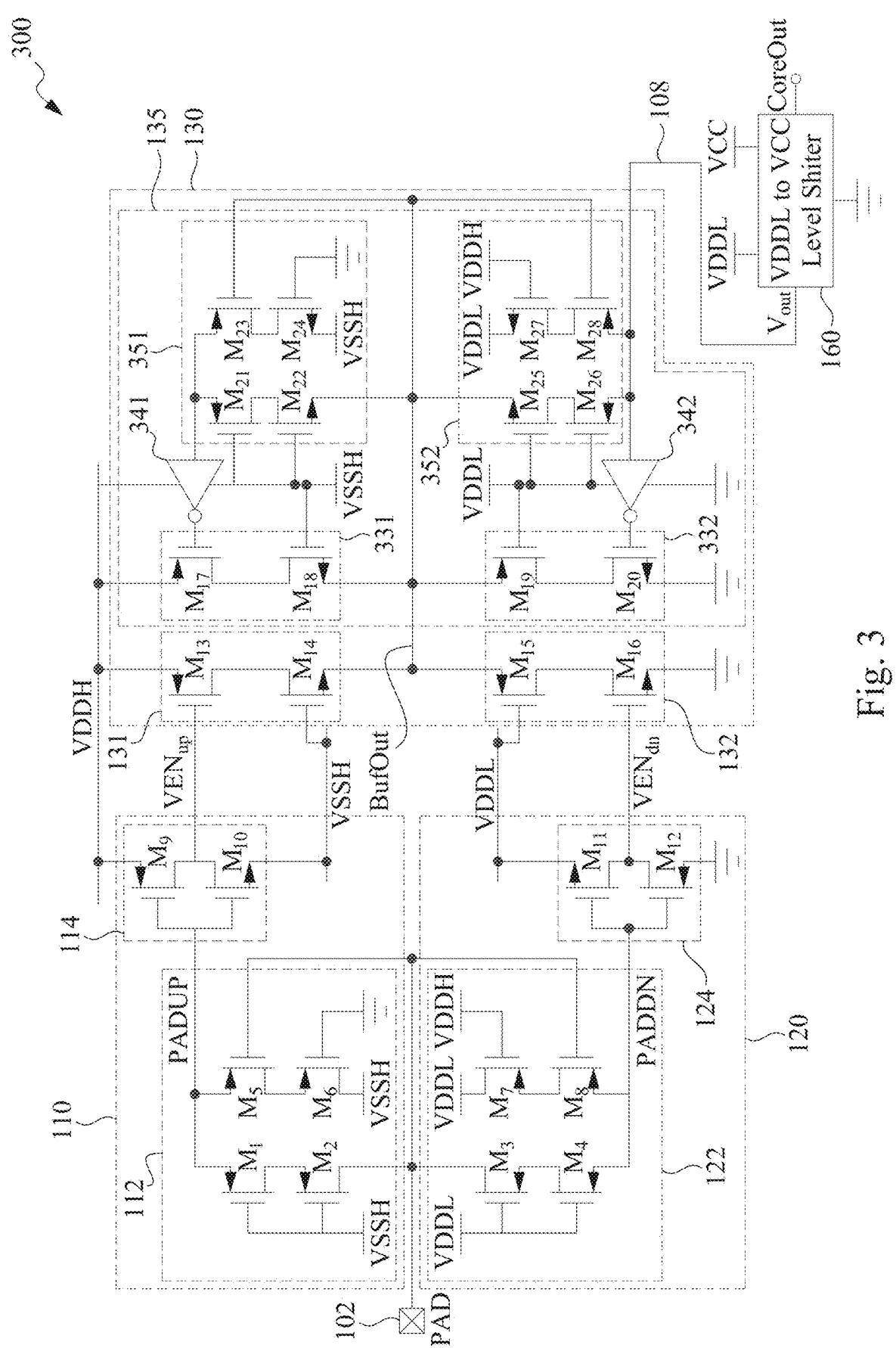
FIG. 3 is a schematic diagram of an implementation of the input buffer circuit, in accordance with some embodiments.

FIG. 3 is a schematic diagram of an input buffer circuit 300 having two threshold circuits and one control circuit, in accordance with some embodiments. Similar to the input buffer circuit 100 in FIG. 1C, the input buffer circuit 300 in FIG. 3 also includes an upper threshold circuit 110, a lower threshold circuit 120, and a control circuit 130. The upper threshold circuit 110 includes a high-side tracker 112 and an upper threshold detector 114. The upper threshold detector 114 is coupled between the high-side tracker 112 and the first switch 131 in the control circuit 130. The lower threshold circuit 120 includes a low-side tracker 122 and a lower threshold detector 124. The lower threshold detector 124 is coupled between the low-side tracker 122 and the second switch 132 in the control circuit 130. In FIG. 3, the input buffer circuit 300 in FIG. 3 also includes switches 331 and 332, inverters 341 and 342, and also the tracker circuits 351 and 352 for forming a regenerative circuit coupled between the buffer output node BufOut and the output node 108.

In FIG. 3, the high-side tracker 112 is implemented with the PMOS transistors M1-M2 and M5-M6. The PMOS transistors M1 and M2 are serially connected between the node of the tracking-up signal PADUP and the input node 102. The gates of the PMOS transistors M1 and M2 are connected to the supply voltage VSSH. The PMOS transistor M5 and M6 are serially connected between the node of the tracking-up signal PADUP and the supply voltage VSSH. The gate of the PMOS transistor M5 is connected to the input node 102. The gate of the PMOS transistor M6 is connected to the supply voltage VSS.

In FIG. 3, the upper threshold detector 114 is implemented with the PMOS transistor M9 and the NMOS transistor M10 serially connected between the supply voltage VDDH and the supply voltage VSSH. The first switch 131 is implemented with the PMOS transistors M13 and M14 serially connected between the supply voltage VDDH and the buffer output node BufOut. The gate of the PMOS transistor M14 is connected to the supply voltage VSSH, and the gate of the PMOS transistor M13 connected to the output node of the upper threshold detector 114.

In FIG. 3, the low-side tracker 122 is implemented with the NMOS transistors M3-M4 and M7-M8. The NMOS transistors M3 and M4 are serially connected between the input node 102 and the node of the tracking-down signal PADDN. The gates of the NMOS transistors M3 and M4 are connected to the supply voltage VDDL. The NMOS transistors M7 and M8 are serially connected between the node of the supply voltage VDDL and the node of the tracking-down signal PADDN. The gate of the NMOS transistor M7 is connected to the supply voltage VDDH. The gate of the NMOS transistor M8 is connected to the node of the tracking-down signal PADDN.

In FIG. 3, the lower threshold detector 124 is implemented with the PMOS transistor M11 and the NMOS transistor M12 serially connected between the supply voltage VDDL and the supply voltage VSS. The second switch 132 is implemented with the NMOS transistors M15 and M16 serially connected between the buffer output node BufOut and the supply voltage VSS. The gate of the NMOS transistor M15 is connected to the supply voltage VDDL, and the gate of the NMOS transistor M16 is connected to the output node of the lower threshold detector 124.

The input buffer circuit 300 in FIG. 3 has a regenerative circuit coupled between the buffer output node BufOut and the output node 108. In the regenerative circuit, each of the switches 331 and 332 is implemented with two transistors. Specifically, the switch 331 is implemented with the PMOS transistors M17 and M18 serially connected between the supply voltage VDDH and the buffer output node BufOut. The gate of the PMOS transistor M18 is connected to the supply voltage VSSH, and the gate of the PMOS transistor M17 is connected to the output node of the inverter 341. The switch 332 is implemented with the NMOS transistors M19 and M20 serially connected between the buffer output node BufOut and the supply voltage VSS. The gate of the NMOS transistor M19 is connected to the supply voltage VDDL, and the gate of the NMOS transistor M20 is connected to the output node of the inverter 342.

For the regenerative circuit in FIG. 3, the tracker circuit 351 is implemented with the PMOS transistors M21-M22 and M23-M24. The PMOS transistor M21 and M22 are serially connected between the input node of the inverter 341 and the buffer output node BufOut. The gates of the PMOS transistor M21 and M22 are connected to the supply voltage VSSH. The PMOS transistors M23 and M24 are serially connected between the node of the input node of the inverter 341 and the supply voltage VSSH. The gate of the PMOS transistor M23 is connected to the buffer output node BufOut. The gate of the PMOS transistor M24 is connected to the supply voltage VSS.

For the regenerative circuit in FIG. 3, the tracker circuit 352 is implemented with the NMOS transistors M25-M26 and M27-M28. The NMOS transistors M25 and M26 are serially connected between the node of the buffer output node BufOut and the input node of the inverter 342. The gates of the NMOS transistor M25 and M26 are connected to the supply voltage VDDL. The NMOS transistors M27 and M28 are serially connected between the node of supply voltage VDDL and the input node of the inverter 342. The gate of the NMOS transistor M27 is connected to the supply voltage VDDH. The gate of the NMOS transistor M28 is connected to the buffer output node BufOut.

Figure 4A:
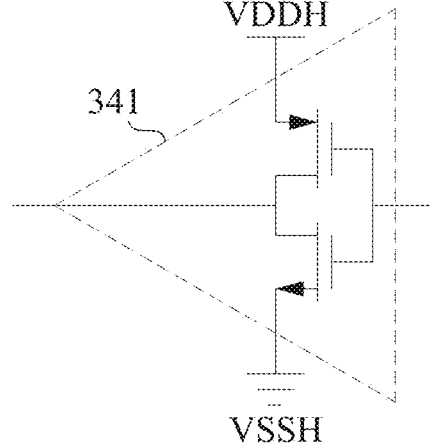
FIGS. 4A-4B are circuit diagrams of the inverters in the input buffer circuit of FIG. 3, in accordance with some embodiments.
Figure 4A:
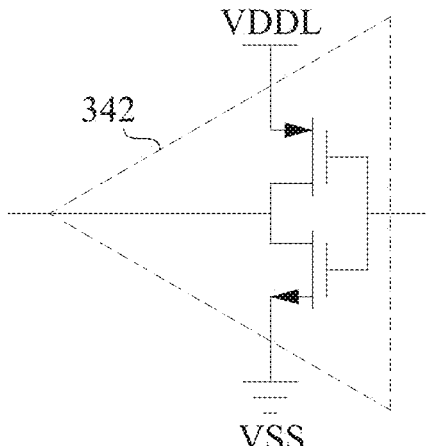
Figure 4B:
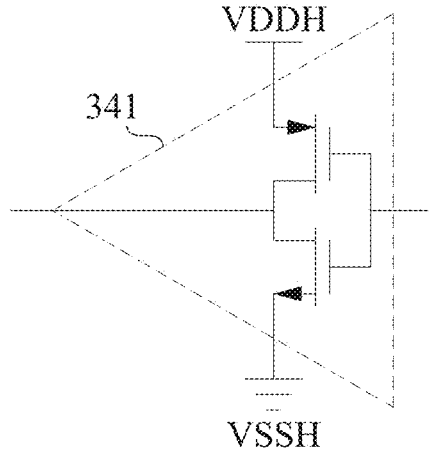
Figure 4B:
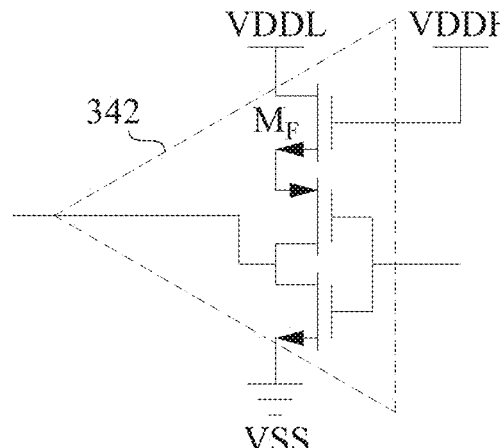

FIGS. 4A-4B are circuit diagrams of the inverters 341 and 342 in the input buffer circuit 300 in FIG. 3, in accordance with some embodiments. In some embodiments, as shown in FIG. 4A, the inverter 341 is implemented with a PMOS transistor and an NMOS transistor serially connected between the supply voltage VDDH and the supply voltage VSSH, and the inverter 342 is implemented with a PMOS transistor and an NMOS transistor serially connected between the supply voltage VDDL and the supply voltage VSS. In some alternative embodiments, as shown in FIG. 4B, the inverter 342 is also implemented with a PMOS transistor and an NMOS transistor serially connected between the supply voltage VDDH and the supply voltage VSSH. In FIG. 4B, however, the inverter 342 is implemented with one PMOS transistors and two NMOS transistor serially connected between the supply voltage VDDL and the supply voltage VSS. The gate of the NMOS transistor $M_F$ is connected to power supply VDDH. Adding the NMOS transistor $M_F$ to the inverter 342 enables compensation with the threshold voltage increasing effect on the NMOS transistor in the inverter 342. With the inverter 342 in FIG. 4B, smaller degradation of hysteresis window is created for the input buffer circuit 300.

In operation, if an input voltage signal PAD as shown in FIG. 2A is coupled to the input node 102 of the input buffer circuit 300 in FIG. 3, the voltage at the buffer output node BufOut of the input buffer circuit 300 has the waveform as shown in FIG. 2F.

Before time t1, the tracking-up signal PADUP at the output of the high-side tracker 112 as induced by the input voltage signal PAD is below the upper threshold voltage $V_{TH}$ of the upper threshold detector 114; consequently, the voltage $VEN_{up}$ at the output of the upper threshold detector 114 is at voltage VDDH, which drives the PMOS transistor M13 into the non-conducting state. The first enabling signal $EN_{up}$ as represented by the voltage $VEN_{up}$ is logic FALSE for the purpose of controlling the first switch 131, and the first switch 131 is driven into the disconnected state. Additionally, the tracking-down signal PADDN at the output of the low-side tracker 122 as induced by the input voltage signal PAD is below the lower threshold voltage $V_{TL}$ of the lower threshold detector 124; consequently, the voltage $VEN_{dn}$ at the output of the lower threshold detector 124 is at voltage VDDL, which drives the NMOS transistor M16 into the conducting state. The second enabling signal $EN_{dn}$ as represented by the voltage $VEN_{dn}$ is logic TRUE for the purpose of controlling the second switch 132, and the second switch 132 is driven into the connected state.

Furthermore, when the buffer output node BufOut is at voltage VSS which is lower than the lower limiting voltage (i.e., VSSH) of the tracker circuit 351, the voltage at the input node of the tracker circuit 351 is maintained at the lower limiting voltage (i.e., VSSH). The voltage VSSH at the input node of the inverter 341 causes the output node of inverter 341 to raise towards a voltage HIGH level that drives the PMOS transistor M17 into the non-conducting state. That is, due to voltage VSSH at the input node of the inverter 341, the switch 331 is driven into the disconnected state. Additionally, when the buffer output node BufOut is at voltage VSS which is lower than the upper limiting voltage (i.e., VDDL) of the tracker circuit 352, the voltage at the input node of the inverter 342 follows the voltage at the buffer output node BufOut and is also at voltage VSS. The voltage VSS at the input node of the inverter 342 causes the voltage at the output node of inverter 342 to drive the NMOS transistor M20 into the conducting state. That is, due to voltage VSS at the input node of the inverter 342, the switch 332 is driven into the connected state.

Before time t1, as shown in FIG. 2F, the buffer output node BufOut is at voltage VSS, when each of the first switch 131 and the switch 331 is at the disconnected state but each of the second switch 132 and the switch 332 is at the connected state.

From time t1 to time t2, the tracking-up signal PADUP at the output of the high-side tracker 112 as induced by the input voltage signal PAD is below the upper threshold voltage $V_{TH}$ of the upper threshold detector 114; consequently, the voltage $VEN_{up}$ at the output of the upper threshold detector 114 is at voltage VDDH, which drives the PMOS transistor M13 into the non-conducting state. The first enabling signal $EN_{up}$ as represented by the voltage $VEN_{up}$ is logic FALSE for the purpose of controlling the first switch 131, and the first switch 131 is driven into the disconnected state. Additionally, the tracking-down signal PADDN at the output of the low-side tracker 122 as induced by the input voltage signal PAD is above the lower threshold voltage $V_{TL}$ of the lower threshold detector 124; consequently, the voltage $VEN_{dn}$ at the output of the lower threshold detector 124 is at voltage VSS, which drives the NMOS transistor M16 into the non-conducting state. The second enabling signal $EN_{dn}$ as represented by the voltage $VEN_{dn}$ is logic FALSE for the purpose of controlling the second switch 132, and the second switch 132 is at the disconnected state. At the time following time t1, even though the second switch 132 is changed from the connected state to the disconnected state, the buffer output node BufOut is maintained at voltage VSS, because the switch 332 is still at the connected state for maintaining the voltage.

From time t1 to time t2, as shown in FIG. 2F, the buffer output node BufOut is at voltage VSS, when each of the first switch 131, the switch 331, and second switch 132 is at the disconnected state but the switch 332 is at the connected state. The voltage at buffer output node BufOut is maintained by the switch 332 in the regenerative circuit 135.

At time t2, the tracking-up signal PADUP at the output of the high-side tracker 112 as induced by the input voltage signal PAD rises above the upper threshold voltage $V_{TH}$ of the upper threshold detector 114; consequently, the voltage $VEN_{up}$ at the output of the upper threshold detector 114 is at voltage VSSH, which drives the PMOS transistor M13 into the conducting state. The first enabling signal $EN_{up}$ as represented by the voltage $VEN_{up}$ is logic TRUE for the purpose of controlling the first switch 131, and the first switch 131 is driven into the connected state. Additionally, at time t2, the tracking-down signal PADDN at the output of the low-side tracker 122 as induced by the input voltage signal PAD is above the lower threshold voltage $V_{TL}$ of the lower threshold detector 124; consequently, the voltage $VEN_{dn}$ at the output of the lower threshold detector 124 is at voltage VSS, which drives the NMOS transistor M16 into the non-conducting state. The second enabling signal $EN_{dn}$ as represented by the voltage $VEN_{dn}$ is logic FALSE for the purpose of controlling the second switch 132, and the second switch 132 is driven into the disconnected state.

After time t2, when the first switch 131 is driven into the connected state, the voltage at the buffer output node BufOut starts to rise from voltage VSS. The voltage at the input node of the inverter 342 follows the buffer output node BufOut until the buffer output node BufOut reaches voltage VDDL. The voltage at the input node of the inverter 342 is maintained at voltage VDDL when the buffer output node BufOut rises above voltage VDDL. The voltage VDDL at the input node of the inverter 342 causes the output node of inverter 342 to lower towards a voltage LOW level that drives the NMOS transistor M20 into the non-conducting state. That is, due to the voltage VDDL at the input node of the inverter 342, the switch 332 is driven into the disconnected state, which causes the voltage at the buffer output node BufOut to rise further because of the connection established between the buffer output node BufOut and the supply voltage VDDH by the inverter 341. When the buffer output node BufOut rises above the voltage VSSH, the voltage at the input node of the inverter 341 continues to follow the voltage at the buffer output node BufOut until the voltage at the buffer output node BufOut reaches the VDDH. The voltage VDDH at the input node of the inverter 341 causes the voltage at the output node of the inverter 341 to drive the PMOS transistor M17 into the conducting state. That is, the switch 331 is driven into the connected state.

From time t2 to time t3, as shown in FIG. 2F, the buffer output node BufOut is at the voltage VDDH, when each of the first switch 131 and the switch 331 is at the connected state and each of the second switch 132 and the switch 332 is at the disconnected state.

From time t3 to time t4, the tracking-up signal PADUP at the output of the high-side tracker 112 as induced by the input voltage signal PAD is below the upper threshold voltage $V_{TH}$ of the upper threshold detector 114; consequently, the voltage $VEN_{up}$ at the output of the upper threshold detector 114 is at voltage VDDH, which drives the PMOS transistor M13 into the non-conducting state. The first enabling signal $EN_{up}$ as represented by the voltage $VEN_{up}$ is logic FALSE for the purpose of controlling the first switch 131, and the first switch 131 is driven into the disconnected state. Additionally, the tracking-down signal PADDN at the output of the low-side tracker 122 as induced by the input voltage signal PAD is above the lower threshold voltage $V_{TL}$ of the lower threshold detector 124; consequently, the voltage $VEN_{dn}$ at the output of the lower threshold detector 124 is at voltage VSS, which drives the NMOS transistor M16 into the non-conducting state. The second enabling signal $EN_{dn}$ as represented by the voltage $VEN_{dn}$ is logic FALSE for the purpose of controlling the second switch 132, and the second switch 132 is at the disconnected state. At the time following time t3, even though the first switch 131 is changed from the connected state to the disconnected state, the buffer output node BufOut is maintained at voltage VDDH, because the switch 331 is still at the connected state for maintaining the voltage.

From time t3 to time t4, as shown in FIG. 2F, the buffer output node BufOut is at voltage VDDH, when each of the first switch 131, second switch 132, and switch 332 is at the disconnected state but the switch 331 is at the connected state. The voltage at buffer output node BufOut is maintained by the switch 331 in the regenerative circuit 135.

At time t4, the tracking-up signal PADUP at the output of the high-side tracker 112 as induced by the input voltage signal PAD is below the upper threshold voltage $V_{TH}$ of the upper threshold detector 114; consequently, the voltage $VEN_{up}$ at the output of the upper threshold detector 114 is at voltage VDDH, which drives the PMOS transistor M13 into the non-conducting state. The first enabling signal $EN_{up}$ as represented by the voltage $VEN_{up}$ is logic FALSE for the purpose of controlling the first switch 131, and the first switch 131 is driven into the disconnected state. Additionally, at time t4, the tracking-down signal PADDN at the output of the low-side tracker 122 as induced by the input voltage signal PAD falls below the lower threshold voltage $V_{TL}$ of the lower threshold detector 124; consequently, the voltage $VEN_{dn}$ at the output of the lower threshold detector 124 is at voltage VDDL, which drives the NMOS transistor M16 into the conducting state. The second enabling signal $EN_{dn}$ as represented by the voltage $VEN_{dn}$ is logic TRUE for the purpose of controlling the second switch 132, and the second switch 132 is driven into the connected state.

After time t4, when the second switch 132 is changed from the disconnected state to the connected state, the buffer output node BufOut starts to fall from voltage VDDH. The voltage at the input node of the inverter 341 follows the buffer output node BufOut until the buffer output node BufOut reaches voltage VSSH. The voltage VSSH at the input node of the inverter 341 causes the output node of inverter 341 to raise towards a voltage HIGH level that drive the PMOS transistor M17 into the non-conducting state. That is, due to the voltage VSSH at the input node of the inverter 341, the switch 331 is driven into the disconnected state, which causes the voltage at the buffer output node BufOut to fall further because of the connection established between to the buffer output node BufOut and the supply voltage VSS by the inverter 342. When the voltage at the buffer output node BufOut falls below the voltage VDDL, the voltage at the input node of the inverter 342 continues to follow the voltage at the buffer output node BufOut until the voltage at the buffer output node BufOut reaches the VSS. The voltage VSS at the input node of the inverter 342 causes the voltage at the output node of the inverter 342 to drive the NMOS transistor M20 into the conducting state. That is, the switch 332 is driven into the connected state.

After time t4, as shown in FIG. 2F, the buffer output node BufOut is at voltage VSS, when each of the first switch 131 and the switch 331 is at the disconnected state but each of the second switch 132 and the switch 332 is at the connected state.

Figures 5A, 5B, 5C, 5D:
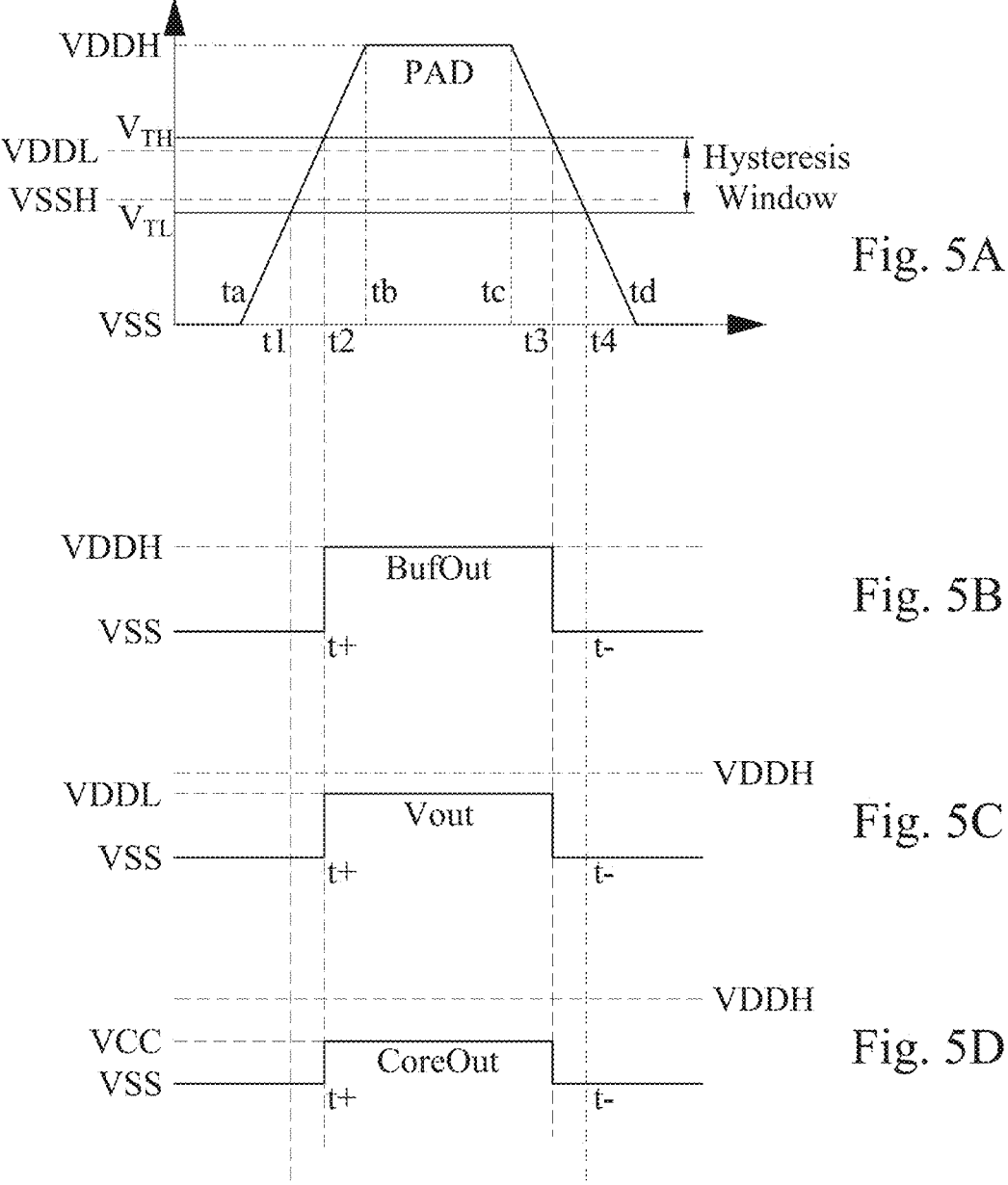
FIG. 5A is the waveform of the input voltage signal of the input buffer circuit, in accordance with some embodiments.
FIG. 5B is the waveform of the voltage at a buffer output node in the input buffer circuit 300, in accordance with some embodiments.
FIG. 5C is the waveform of the output voltage signal of the input buffer circuit, in accordance with some embodiments.
FIG. 5D is the waveform of the voltage signal of the level shifter, in accordance with some embodiments.

Waveforms of signals at various circuit nodes in FIG. 3 are depicted in FIGS. 5A-5D. FIG. 5A is the waveform of the input voltage signal PAD at the input node 102 of the input buffer circuit 300, in accordance with some embodiments. The waveform of the input voltage signal PAD in FIG. 5A is the same as the waveform in FIG. 2A. FIG. 5B is the waveform of the voltage at the buffer output node BufOut in the input buffer circuit 300, in accordance with some embodiments. The waveform of the voltage at the buffer output node BufOut is the same as the waveform in FIG. 2F. FIG. 5C is the waveform of the output voltage signal Vout at the output node 108 of the input buffer circuit 100, in accordance with some embodiments. FIG. 5D is the waveform of the voltage signal CoreOut at the output node of the level shifter 160, in accordance with some embodiments.

In FIGS. 5A-5D, as the input voltage signal PAD rises, the input voltage signal PAD crosses the lower threshold voltage $V_{TL}$ at time t1 and crosses the upper threshold voltage $V_{TH}$ at time t2. The voltage at the buffer output node BufOut in FIG. 5B changes from the lower supply voltage VSS to the upper supply voltage VDDH at time t2, which is identified as time t+ in FIGS. 5B-5D. As the input voltage signal PAD falls, the input voltage signal PAD crosses the upper threshold voltage $V_{TH}$ at time t3 and crosses the lower threshold voltage $V_{TL}$ at time t4. The voltage at the buffer output node BufOut in FIG. 5B changes from the upper supply voltage VDDH to the lower supply voltage VSS at time t4, which is identified as time t− in FIGS. 5B-5D.

In FIG. 3, the buffer output node BufOut is connected to the input node of the tracker circuit 352 and the output node 108 is connected to the output node of the tracker circuit 352. The output voltage signal Vout follows the voltage at the buffer output node BufOut if the voltage at the buffer output node BufOut is smaller voltage VDDL, but the output voltage signal Vout is maintained at voltage VDDL if the voltage at the buffer output node BufOut is larger than or equal to voltage VDDL. Consequently, the output voltage signal Vout in FIG. 5C changes from voltage VSS to voltage VDDL at time t+, and changes from voltage VDDL to voltage VSS to at time t−.

In FIG. 3, the output voltage signal Vout at the output node 108 is further coupled to the level shifter 160, and the voltage signal CoreOut is generated at the output terminal of the level shifter 160 from the output voltage signal Vout. Because of the level shifter 160, the voltage signal CoreOut in FIG. 5D changes from voltage VSS to voltage VCC at time t+, and changes from voltage VCC to voltage VSS to at time t−.

The upper threshold voltage $V_{TH}$ and the lower threshold voltage $V_{TL}$ as shown in in FIG. 5A are correspondingly determined by the upper threshold detector 114 and the lower threshold detector 124 (in FIG. 1C and FIG. 3). In FIG. 3, the upper threshold voltage $V_{TH}$ is determined by the threshold voltage of the upper threshold detector 114. When the upper threshold detector 114 is implemented with the PMOS transistor M9 and the NMOS transistor M10 serially connected between the supply voltage VDDH and the supply voltage VSSH, the threshold voltage of the upper threshold detector 114 is related to the driving strengths of the PMOS transistor M9 and the NMOS transistor M10. The supply voltage VDDH is an upper supply voltage for the upper threshold detector 114, and the supply voltage VSSH is an intermediate lower supply voltage for the upper threshold detector 114. In some embodiments, if the driving strength of the PMOS transistor M9 is equal to the driving strength of the NMOS transistor M10, the threshold voltage of the upper threshold detector 114 (and the upper threshold voltage $V_{TH}$ of the input buffer circuit 300) is equal to (VDDH+VSSH)/2. In some embodiments, the upper threshold voltage $V_{TH}$ of the input buffer circuit 300 is adjusted by changing the driving strength of the PMOS transistor M9, the driving strength of the NMOS transistor M10, the supply voltage VDDH, and/or the supply voltage VSSH.

In FIG. 3, the lower threshold voltage $V_{TL}$ is determined by the threshold voltage of the lower threshold detector 124. When the lower threshold detector 124 is implemented with the PMOS transistor M11 and the NMOS transistor M12 serially connected between the supply voltage VDDL and the supply voltage VSS, the threshold voltage of the lower threshold detector 124 is related to the driving strengths of the PMOS transistor M11 and the NMOS transistor M12. The supply voltage VDDL is an intermediate upper supply voltage for the lower threshold detector 124, and the supply voltage VSS is a lower supply voltage for the lower threshold detector 124. In some embodiments, if the driving strength of the PMOS transistor M11 is equal to the driving strength of the NMOS transistor M12, the threshold voltage of the lower threshold detector 124 (and the lower threshold voltage $V_{TL}$ of the input buffer circuit 300) is equal to (VDDL+VSS)/2. In some embodiments, the lower threshold voltage $V_{TL}$ of the input buffer circuit 300 is adjusted by changing the driving strength of the PMOS transistor M11, the driving strength of the NMOS transistor M12, the supply voltage VDDL, and/or the supply voltage VSS.

Figure 6:
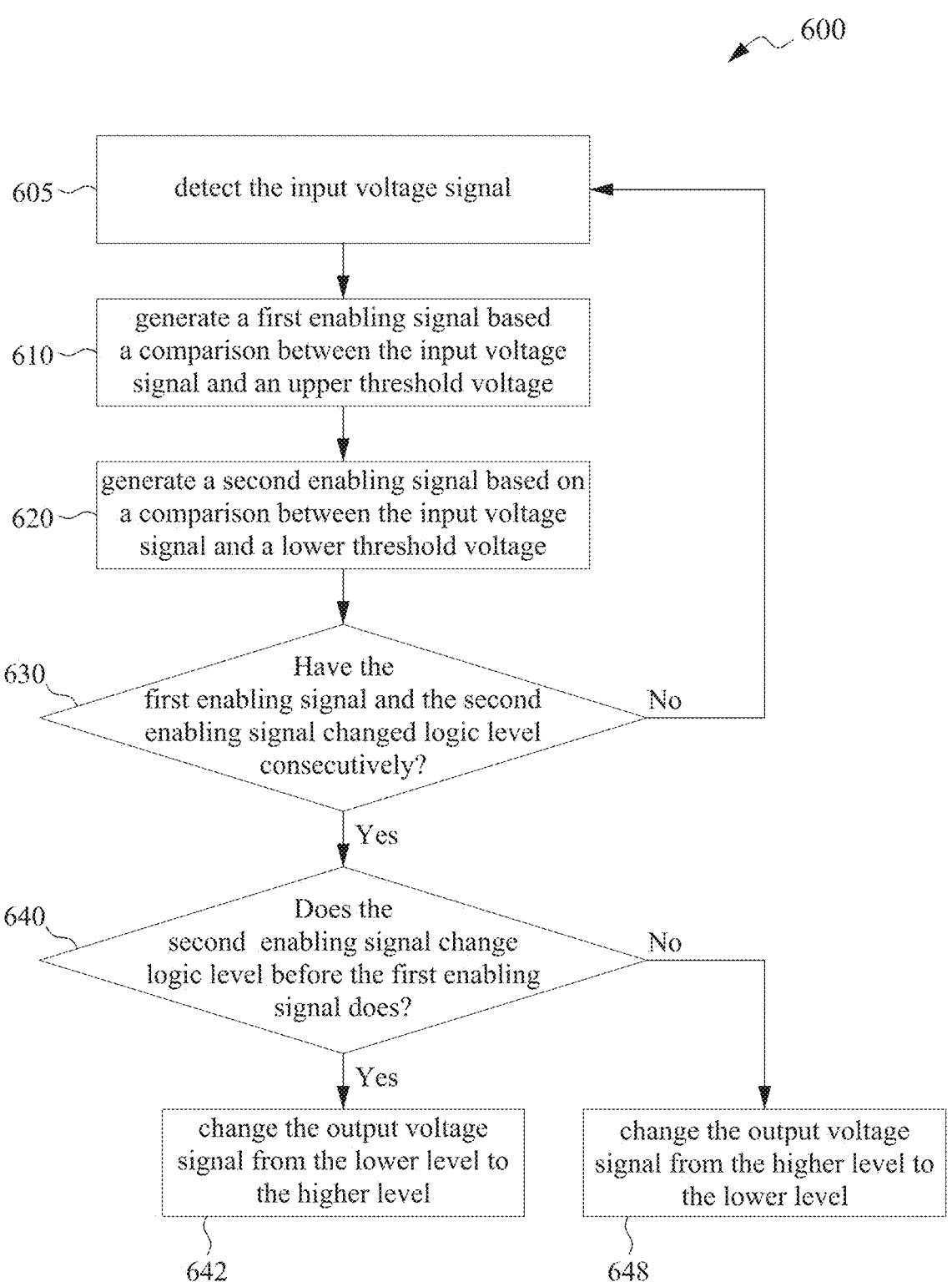
FIG. 6 is a flowchart of a method of generating an output voltage signal from an input voltage signal, in accordance with some embodiments.

FIG. 6 is a flowchart of a method 600 of generating an output voltage signal from an input voltage signal, in accordance with some embodiments. The sequence in which the operations of method 600 are depicted in FIG. 6 is for illustration only; the operations of method 600 are capable of being executed in sequences that differ from that depicted in FIG. 6. It is understood that additional operations may be performed before, during, and/or after the method 600 depicted in FIG. 6, and that some other processes may only be briefly described herein.

In operation 605 of method 600, the input voltage signal is detected. In the embodiments as shown in FIG. 1A, the input voltage signal PAD at an input node 102 is coupled to the upper threshold circuit 110 and the lower threshold circuit 120. In the embodiments as shown in FIG. 1C, the input voltage signal PAD at an input node 102 is coupled to the high-side tracker 112 in the upper threshold circuit 110 and coupled to the low-side tracker 122 in the lower threshold circuit 120.

In operation 610 of method 600, a first enabling signal is generated based a comparison between the input voltage signal and an upper threshold voltage. In the embodiments as shown in FIG. 1A, the input voltage signal PAD at an input node 102 of the input buffer circuit 100 is coupled to the upper threshold circuit 110, and The upper threshold circuit 110 is configured to generate a first enabling signal $EN_{up}$ based on a comparison between an input voltage signal PAD and the upper threshold voltage $V_{TH}$.

In operation 620 of method 600, a second enabling signal is generated based on a comparison between the input voltage signal and a lower threshold voltage. In the embodiments as shown in FIG. 1A, the input voltage signal PAD at an input node 102 of the input buffer circuit 100 is coupled to the lower threshold circuit 120, and the lower threshold circuit 120 is configured to generated a second enabling signal $EN_{dn}$ based on a comparison between the input voltage signal PAD and the lower threshold voltage $V_{TL}$.

In operation 630 of method 600, a decision maker determines whether the first enabling signal and the second enabling signal have changed logic level consecutively. In operation 640 of method 600, a decision maker determines whether the second enabling signal change changes logic level before the first enabling signal does. In the embodiments as shown in FIG. 1C, the combination of the first switch 131, the second switch 132, and the regenerative circuit 135 determines whether the first enabling signal $EN_{up}$ and the second enabling signal $EN_{dn}$ have changed logic level consecutively. The combination of the first switch 131, the second switch 132, and the regenerative circuit 135 also determines whether the second enabling signal change changes logic level before the first enabling signal does.

If the second enabling signal changes logic level before the first enabling signal does, then, in operation 642 of method 600, the output voltage signal is changed from the lower level to the higher level. On the other hand, if the first enabling signal changes logic level before the second enabling signal does, then, in operation 648 of method 600, the output voltage signal is changed from the higher level to the lower level. In the embodiments as shown in FIG. 1C, as shown in FIGS. 2D-2E, after the second enabling signal $EN_{dn}$ is changed from logic TRUE to logic FALSE at time t1, when the first enabling signal $EN_{up}$ is changed from logic FALSE to logic TRUE at time t2, the voltage at the buffer output node BufOut is changed from the lower supply voltage VSS to the upper supply voltage VDDH at time t2. Correspondingly, the output voltage in FIG. 5B is changed from the lower supply voltage VSS to the upper supply voltage VDDH at time t2. On the other hand, as shown in FIGS. 2D-2E, after the first enabling signal $EN_{up}$ is changed from logic TRUE to logic FALSE at time t3, when the second enabling signal $EN_{dn}$ is changed from logic FALSE to logic TRUE at time t4, the voltage at the buffer output node BufOut is changed from the upper supply voltage VDDH to the lower supply voltage VSS to at time t4. Correspondingly, the output voltage in FIG. 5B is changed from the upper supply voltage VDDL to the lower supply voltage VSS at time t4.

An aspect of the present disclosure relates to an integrated circuit. The integrated circuit includes an upper threshold circuit, a lower threshold circuit, and a control circuit. The upper threshold circuit is configured to set a logic level of a first enabling signal in response to an input voltage signal rising across an upper threshold voltage. The lower threshold circuit is configured to set a logic level of a second enabling signal in response to the input voltage signal falling across a lower threshold voltage. The control circuit is configured to change an output voltage signal from a first voltage level to a second voltage level in response to a condition that the logic level of the first enabling signal and the logic level of the second enabling signal are changed consecutively. The control circuit includes a first switch configured to receive the first enabling signal from the upper threshold circuit, a buffer output node electrically connected to the first switch, and a second switch electrically connected to the first switch at the buffer output node and configured to receive the second enabling signal from the lower threshold circuit. The control circuit also includes a regenerative circuit electrically coupled to the buffer output node and configured to maintain the output voltage signal at the buffer output node while each of the first switch and the second switch is at a disconnected state.

Another aspect of the present disclosure relates to a method. The method includes generating a first enabling signal in response to an input voltage signal rising across an upper threshold voltage, and generating a second enabling signal in response to the input voltage signal falling across a lower threshold voltage. The method also includes controlling a first switch with the first enabling signal, and controlling a second switch with the second enabling signal, wherein the second switch is connected to the first switch at a buffer output node. The method further includes changing an output voltage signal from a first voltage level to a second voltage level in response to a condition that each of the first enabling signal and the second enabling signal changes a logical level consecutively. Changing the output voltage signal comprises maintaining the output voltage signal at the buffer output node with a regenerative circuit while each of the first switch and the second switch is at a disconnected state.

Another aspect of the present disclosure still relates to an integrated circuit. The integrated circuit includes an upper threshold circuit, a lower threshold circuit, a first switch, a buffer output node, a second switch, and a regenerative circuit. The upper threshold circuit is configured to set a logic level of a first enabling signal in response to an input voltage signal rising across an upper threshold voltage. The lower threshold circuit is configured to set a logic level of a second enabling signal in response to the input voltage signal falling across a lower threshold voltage. The first switch is configured to receive the first enabling signal from the upper threshold circuit. The buffer output node is electrically connected to the first switch. The second switch is electrically connected to the first switch at the buffer output node and configured to receive the second enabling signal from the lower threshold circuit. The regenerative circuit is electrically coupled to the buffer output node and configured to maintain an output voltage signal at the buffer output node while each of the first switch and the second switch is at a disconnected state.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:

an upper threshold circuit configured to set a logic level of a first enabling signal in response to an input voltage signal rising across an upper threshold voltage;

a lower threshold circuit configured to set a logic level of a second enabling signal in response to the input voltage signal falling across a lower threshold voltage; and a control circuit configured to change an output voltage signal from a first voltage level to a second voltage level in response to a condition that the logic level of the first enabling signal and the logic level of the second enabling signal are changed consecutively, wherein the control circuit comprises, a first switch configured to receive the first enabling signal from the upper threshold circuit, a buffer output node electrically connected to the first switch, a second switch electrically connected to the first switch at the buffer output node and configured to receive the second enabling signal from the lower threshold circuit, and a regenerative circuit electrically coupled to the buffer output node and configured to maintain the output voltage signal at the buffer output node while each of the first switch and the second switch is at a disconnected state.

2. The integrated circuit of claim 1, wherein:

the control circuit is configured to change the output voltage signal from the first voltage level to the second voltage level if the first enabling signal changes a logic level after the second enabling signal changes a logic level.

3. The integrated circuit of claim 1, wherein:

the control circuit is configured to change the output voltage signal from the second voltage level to the first voltage level if the first enabling signal changes a logic level before the second enabling signal changes a logic level.

4. The integrated circuit of claim 1, wherein:

the first voltage level is equal to a lower supply voltage; and the second voltage level is equal to an upper supply voltage.

5. The integrated circuit of claim 1, wherein:

the upper threshold circuit is configured to be powered by an upper supply voltage and an intermediate lower supply voltage.

6. The integrated circuit of claim 1, wherein:

the lower threshold circuit is configured to be powered by an intermediate upper supply voltage and a lower supply voltage.

7. The integrated circuit of claim 1, wherein the upper threshold circuit comprises:

a high-side tracker configured to receive the input voltage signal; and an upper threshold detector configured to receive a tracking-up signal from the high-side tracker.

8. The integrated circuit of claim 1, wherein the lower threshold circuit comprises:

a low-side tracker configured to receive the input voltage signal; and a lower threshold detector configured to receive a tracking-down signal from the low-side tracker.

9. The integrated circuit of claim 1, wherein the first switch electrically is connected between an upper supply voltage and the buffer output node, wherein the first switch is configured to be controlled by the first enabling signal; and wherein the second switch electrically is connected between the buffer output node and a lower supply voltage, wherein the second switch is configured to be controlled by the second enabling signal.

10. The integrated circuit of claim 9, wherein the regenerative circuit has a switch therein which is configured to be controlled with a voltage on the buffer output node.

11. The integrated circuit of claim 1, further comprising:

a level shifter configured to receive the output voltage signal from the control circuit; and wherein the level shifter is configured to generate a second output voltage signal in a second power domain based on the output voltage signal received.

12. A method comprising:

generating a first enabling signal in response to an input voltage signal rising across an upper threshold voltage;

generating a second enabling signal in response to the input voltage signal falling across a lower threshold voltage;

controlling a first switch with the first enabling signal;

controlling a second switch with the second enabling signal, wherein the second switch is connected to the first switch at a buffer output node; and changing an output voltage signal from a first voltage level to a second voltage level in response to a condition that each of the first enabling signal and the second enabling signal changes a logical level consecutively, wherein changing the output voltage signal comprises maintaining the output voltage signal at the buffer output node with a regenerative circuit while each of the first switch and the second switch is at a disconnected state.

13. The method of claim 12, wherein changing the output voltage signal comprises:

changing the output voltage signal from the first voltage level to the second voltage level if the first enabling signal changes a logic level after the second enabling signal changes a logic level.

14. The method of claim 12, wherein changing the output voltage signal comprises:

changing the output voltage signal from the second voltage level to the first voltage level if the first enabling signal changes a logic level before the second enabling signal changes a logic level.

15. The method of claim 12, wherein the first switch is electrically connected between an upper supply voltage and the buffer output node, wherein the first switch is configured to be controlled by the first enabling signal, and wherein the second switch is electrically connected between the buffer output node and a lower supply voltage.

16. An integrated circuit comprising:

an upper threshold circuit configured to set a logic level of a first enabling signal in response to an input voltage signal rising across an upper threshold voltage;

a lower threshold circuit configured to set a logic level of a second enabling signal in response to the input voltage signal falling across a lower threshold voltage;

a first switch configured to receive the first enabling signal from the upper threshold circuit;

a buffer output node electrically connected to the first switch;

a second switch electrically connected to the first switch at the buffer output node and configured to receive the second enabling signal from the lower threshold circuit; and a regenerative circuit electrically coupled to the buffer output node and configured to maintain an output voltage signal at the buffer output node while each of the first switch and the second switch is at a disconnected state.

17. The integrated circuit of claim 16, wherein the regenerative circuit has a switch therein which is configured to be controlled with a voltage on the buffer output node.

18. The integrated circuit of claim 16, wherein:

the upper threshold circuit is configured to be powered by a upper supply voltage and an intermediate lower supply voltage.

19. The integrated circuit of claim 16, wherein:

the lower threshold circuit is configured to be powered by an intermediate upper supply voltage and a lower supply voltage.

20. The integrated circuit of claim 16, further comprising:

a level shifter configured to receive the output voltage signal at the buffer output node.

* * * * *